United States Patent [19]

Albaugh et al.

[11] 4,346,294

[45] Aug. 24, 1982

[54] LOW PROFILE OPTICAL COUPLING TO PLANAR-MOUNTED OPTOELECTRONIC DEVICE

[75] Inventors: Neil P. Albaugh; Robert M. Stitt, both of Tucson, Ariz.

[73] Assignee: Burr-Brown Research Corp., Tucson, Ariz.

[21] Appl. No.: 280,841

[22] Filed: Jul. 6, 1981

Related U.S. Application Data

[63] Continuation of Ser. No. 55,032, Jul. 5, 1979, abandoned.

[51] Int. Cl.³ .............................................. G02B 5/14
[52] U.S. Cl. ..................................... 250/227; 250/239
[58] Field of Search ....................... 250/227, 551, 239; 350/96.29, 96.33, 96.15; 455/612

[56] References Cited

U.S. PATENT DOCUMENTS

| | | | |
|---|---|---|---|
| 3,542,451 | 11/1970 | Washburn | 250/227 |
| 3,756,688 | 9/1973 | Hudson et al. | 350/96.33 |
| 3,785,716 | 1/1974 | Maurer | 350/96.29 |
| 3,879,606 | 4/1975 | Bean | 250/227 |
| 3,896,305 | 7/1975 | Ostrowsky et al. | 250/227 |
| 4,114,177 | 9/1978 | King | 250/551 |
| 4,184,070 | 1/1980 | McBride | 250/551 |

Primary Examiner—David C. Nelms
Attorney, Agent, or Firm—Harry M. Weiss

[57] ABSTRACT

Means and method for achieving a low profile optical coupling to a planar mounted optoelectronic device. Maintaining the optoelectronic device planar to the substrate on which it and associated circuitry are mounted enables the use of standard, well known manufacturing assembly techniques while providing electrical connection to the electric ports of said optoelectronic device. Optical fiber, light coupling is utilized. The low profile of the overall package is achieved by introducing the optical fiber on a plane which is generally parallel to the light-active surface of the optic port of said optoelectronic device. Actual optical coupling is achieved by introducing a smooth radius bend in the optical fiber so as to bring the fiber and the light-active surface of the optoelectronic device into generally orthogonal relationship. A glass-to-metal seal is provided where the optic fiber enters the package so as to provide a hermetic seal. Further mechanical and environmental support is provided by encapsulating the assembly, within its package, in an encapsulating medium having an index of refraction essentially matching that of the core of the optical fiber and the optic port of said optoelectronic device so as to reduce the possibility of reflective losses at the juncture of the fiber and said light active surface of said optic port. Efficiency and light handling ability of an optical light fiber are increased by providing a mirror-like interface along its entire length and utilizing both the central core and its cladding as light transmission media.

4 Claims, 5 Drawing Figures

LOW PROFILE OPTICAL COUPLING TO PLANAR-MOUNTED OPTOELECTRONIC DEVICE

This application is a continuation of application Ser. No. 055,032, filed July 5, 1979, now abandoned.

BACKGROUND OF THE INVENTION

1. Field of the Invention

The invention relates generally to optoelectronic devices and means for optically coupling thereto.

More particularly the invention relates to a low profile silhouette package of an optoelectronic device and an associated optical coupler.

Even more specifically the invention relates to a planar substrate having an optoelectronic device mounted generally planar thereto in a module package to which an optical light fiber is introduced on a line essentially parallel with said planar substrate.

1. Prior Art

An optoelectronic device is an electronic device combining both optic and electric ports. Hereinafter, the optoelectronic device will be referred to as an "op-el" device. An op-el device may be either a light receiver, such as a photodiode, or a light transmitter, such as a light emitting diode (LED). The op-el device may be formed of op-el cells as part of an integrated circuit device or it may be a discrete component on a hybrid circuit device.

In general, the prior art provides two methods for providing light coupling to an op-el module. In the first of these, the op-el device is generally planar with the substrate of the associated circuitry. Where the planar situs is employed, conventional production techniques may be utilized to provide the necessary electric connections to the electric ports of the op-el device. Light coupling means, most frequently in the form of light conducting fibers, are introduced to the op-el package at an angle substantially normal to the substrate plane in which the op-el device lies. The light fiber is supported in an optical fiber connector and the overall assembly of optical connector and module package is somewhat reminiscent of the outline of a single story factory building having a tall smokestack rising upwards from its roof structure.

To reduce the profile of the silhouette of the op-el device package, a second approach to introducing optical coupling is employed. With this alternate approach, the op-el device is a discrete component mounted on a dielectric standoff above the substrate of the associated circuitry such that the plane of the optic ports of the op-el device is generally perpendicular to the plane of the substrate. This configuration has distinct disadvantages in that standard production techniques for making connection to the electric ports of the op-el device can no longer be utilized. Special manufacturing procedures must be devised and used to successfully produce a module of this type. However, this configuration permits the optical connector to introduce the optical fiber on a plane essentially parallel with the plane of the substrate, thus somewhat increasing the length of the package while still maintaining its low profile silhouette.

Prior art which relates to photodetector packaging and optical coupling systems may be found in U.S. Pat. Nos. 3,757,127; 4,112,308; and 4,136,357. None of this known prior art discloses apparatus or methods for maintaining a low package silhouette when optically coupling to an op-el device package while maintaining the op-el device essentially planar with the substrate of the associated circuitry.

Accordingly it is an object of the present invention to provide an op-el module utilizing fiber optics to provide light coupling, which module shall present a low profile silhouette.

It is a further object of the invention to provide a low profile silhouette package utilizing optical fiber, light coupling to an op-el device, which op-el device is essentially planar with the substrate of the associated circuitry within the package.

It is a more specific objective of the invention to provide fiber optic light coupling through an op-el device in such a manner that the optical fiber performs a secondary function in simplifying the manufacturing and assembly of the fiber optic/op-el device module.

SUMMARY OF THE INVENTION

The invention provides a modular package which contains a substrate, either hybrid or integrated circuitry, having an op-el device essentially planar therewith. An optical fiber which provides light coupling to said op-el device is supported in a plane substantially parallel to said substrate. Coupling between the light fiber and the op-el device is achieved by forming the light fiber so as to cause it to depart from the plane in which it nominally lies and to meet the optic port of said op-el device substantially at a right angle. When the end of the optical fiber has made contact with the optical port of the op-el device, the optical fiber exerts a compressive force on the op-el device. Positive contact between the optical fiber and the op-el device is thus assured. Further, when the op-el device comprises a discrete component in a hybrid circuit, the compressive force of the optical fiber may be utilized in maintaining the op-el device in position during fabrication of the module. The op-el device may be either a photon emitting or photon receiving device.

DESCRIPTION OF THE DRAWINGS

FIGS. 4 A-B show optic fibers in cross-section.

DESCRIPTION OF THE INVENTION

Figure 1:
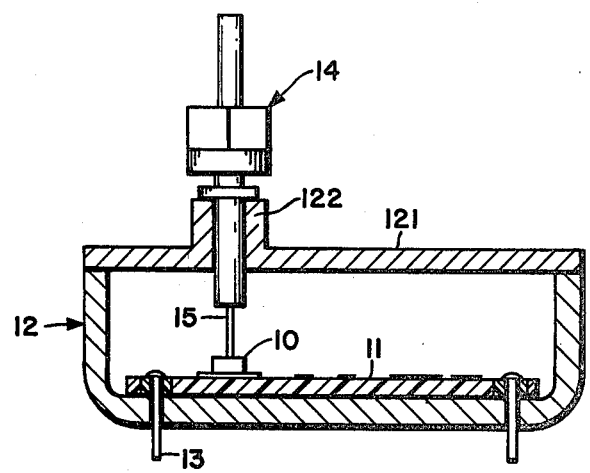
FIG. 1 illustrates a prior art optic fiber coupled op-el device module in which the op-el device is essentially planar with the substrate of the associated circuitry and the optic fiber is introduced directly to the op-el device on a line essentially normal to the optic port surface of the op-el device.

A review of the prior art will assist in understanding the innovation and the advantages which lie in the invention taught herein. FIG. 1 illustrates an op-el device 10 mounted planar to substrate 11 all of which is mounted in protective package 12. Means for providing electrical signals to and from associated circuitry on substrate 11 is suggested by pin terminals 13.

The optic port of op-el device 10 is an optically active surface essentially planar in character. The cover 121 of package 12 has a raised boss 122 which provides the means for mounting optical fiber connector 14. Connector 14 supports optical fiber 15 and introduces it into package 12 so that it couples directly at a substantially right angle with the planar light active surface portion, that is, the optic port, of op-el device 10.

The construction of the package of FIG. 1 allows the circuitry on substrate 11 to be manufactured using conventional techniques well known in the art. However, connector 14, rising normal to the upper surface of package 12, reduces the available packaging density of the system in which the package may be utilized.

Figure 2:
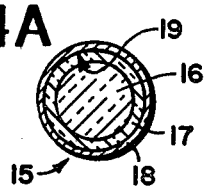
FIG. 2 illustrates an alternate prior art approach used to provide fiber optic light coupling to an op-el device wherein the op-el device is raised above the substrate and supported on a dielectric standoff while the fiber optic is brought in on a line normal to the optic port surface of the op-el device and in a plane essentially parallel to that of the substrate.
Figure 2:
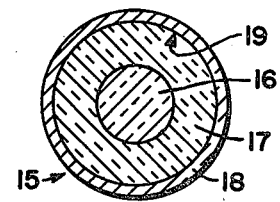
Figure 2:
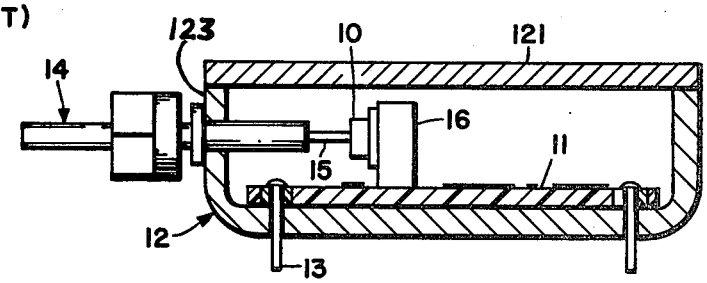

In FIG. 2 is illustrated the prior art solution to reducing package profile and therefore increasing packaging density of the system utilizing the device illustrated. In this approach, op-el device 10 is raised above the surface of substrate 11 by mounting it on dielectric standoff 16. This arrangement requires that special techniques be utilized in conveying electrical signals to and from the electric ports of op-el device 10. Specialized techniques of manufacture, differing from those utilized in the manufacture of the device illustrated in FIG. 1, must now be devised.

The low profile of the package of FIG. 2 is preserved by introducing optical connector 14 through side wall 123 of package 12. Connector 14 supports optical fiber 15 in a plane essentially parallel with the surface of substrate 11. Optical fiber 15 is brought directly to op-el 10 and couples therewith at substantially a right angle to its optic port. As noted, although the low profile and higher packaging density characteristic of this package is preserved, the disadvantage lies in the specialized techniques and additional manufacturing steps which must be utilized in providing electrical connections to the electric ports of op-el device 10.

Figure 3:
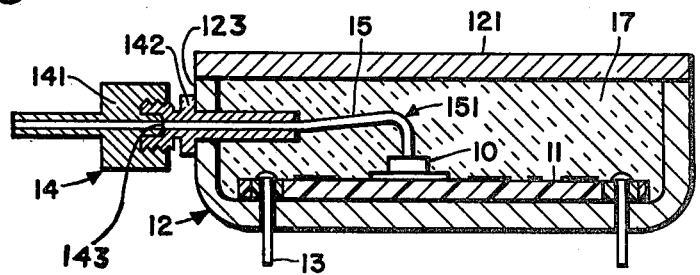
FIG. 3 illustrates the teachings of the invention herein in which a fiber optic coupled op-el module achieves a low profile silhouette by introducing the fiber optic into the package in a plane essentially parallel to the substrate of the associated circuitry and forming the fiber optic so as to meet with the optic port surface of the op-el device at essentially a right angle, the op-el device being essentially planar with said substrate.

In FIG. 3 the teachings of the invention herein are set forth. Optical connector 14 carries optic fiber 15 through package wall 123. Optical fiber 15 is thus introduced to the module in a plane which is essentially parallel to the light active planar surface of op-el device 10. A smooth radius bend 151 is introduced in optic fiber 15 to permit light coupling between optic fiber 15 and op-el device 10. An hermetic seal is provided between optic fiber 15 and connector 14 by means of a glass to metal seal between the optic fiber and that portion 142 of connector 14 which enters package 12. The hermetic seal is achieved utilizing metalization techniques to metalize the optical fiber 15 and to affix it within connector portion 142 by forming a solder seal.

In the assembly of the module illustrated in FIG. 3, light fiber 15 exerts a compressive force on the optic port of op-el device 10. This compressive force may be utilized to simplify the alignment of fiber optic 15 and the optic port of op-el device 10, as well as providing a means for maintaining op-el device 10 in position on substrate 11 while the necessary electrical connections are made to its electric ports. For example, assume that op-el device 10 is an LED or a photodiode detector. To assemble such a discrete component to the circuitry on substrate 11, the diode, with a solder preform, say a gold-germanium alloy, placed beneath said diode, is coupled to optical fiber 15 and adjusted to proper position on substrate 11. The slight compressive force exerted by optic fiber 15 maintains the diode, op-el device 10, and its solder preform in position on substrate 11 while the entire package is subjected to sufficient heat to flow the gold-germanium alloy and create a solder bond and electrical connections from the circuit lines of substrate 11 to the electric ports of the diode, op-el device 10.

For high coupling efficiency the interface at the juncture of the transverse face of optical fiber 15 and the optic port of op-el device 10 must be essentially eliminated. The lack of an interface implies that the index of refraction of both the optical fiber and the optic port are equal and no air gap exists between the two elements. The air gap may be eliminated by utilizing an epoxy, or casting resin, or other suitable substance having an index of refraction equal to that of the fiber and the optic port. With such an arrangement, no reflective losses occur at the juncture of the fiber and the optic port.

Where the fiber and the optic port have different indices of refraction, an epoxy, or casting resin, or other suitable substance having an index of refraction "n" which approximates the geometric mean of the indices of refraction of the fiber core and optic port may be used. For example:

$$n = \sqrt{n_f + n_p}$$

where "$n_f$" is the index of the fiber core and "$n_p$" is the index of the optic port.

Referring to FIGS. 4A and 4B which depict different fiber optic elements a still further improvement in efficiency may be achieved by metalizing 18 the outer surface of optical fiber 15. If, for example, in metalizing the fiber's surface, an initial film of gold of about 100 microns in thickness is laid on the outer surface of optical fiber 15, a mirror-like interface 19 will be presented to light which reflects refracting light striking it and retains the light within optical fiber 15. This increases the net quanitity of light transmitted through optical fiber 15 to or from op-el device 10. See FIG. 4 A.

That portion 141 of optical connector 14 is adapted to accept an optical fiber, light transmission line which mates with optical fiber 15 at junction 143. Portion 141 of connector 14 holds the optical fiber, light transmission line so its core will essentially center on the core of optical fiber 15. If the core of the light transmission line is equal to, or smaller than, the core of optical fiber 15, essentially all of the light passing along the light transmission line to optical fiber 15 will be transferred to op-el device 10.

However, if the core of the light transmission line is larger than the core of optical fiber 15, or if some misalignment is introduced in assembling parts 141 and 142 of optical connector 14, then some of the light traveling along the light transmission line will not be coupled to optical fiber 15 for transfer to op-el device 10.

This problem of inefficient light transfer between the external light transmission line and optical fiber 15 can be obviated by adhering to the following teachings of the instant invention.

Glass optical fibers may be generally divided into two types. Both have a central core 16 of about eight mils (0.008 inches) diameter. Both have a glass cladding 17 over the central core. In one type, the cladding is thin, about one mil, yielding a composite fiber of about ten mils diameter. The second type has a thick cladding of about four mils thickness, yielding a composite fiber of about sixteen mils diameter. FIGS. 4 A-B respectively.

In using either type, light which escapes from the core 16 into the cladding 17 is generally considered lost. Technically, the most significant difference between the thick and the thin clad optical fibers is the relative ease with which the thick clad fiber may be fabricated as the fibers are drawn to their final dimensions.

An even greater improvement in efficiency in light transfer than that already set out herein may be gained by selecting optical fiber 15 as one of the thick clad fibers (FIG. 4 B) described above. The thick clad, optical fiber 15 is then metalized 18 along its entire length to provide a mirror-like interface 19 at the outer surface of the fiber. Any light which is now introduced or which escapes into the cladding 17 is retained within the cladding by the reflective interface 19 at its outer surface. Both the core and the cladding may now be utilized for the transfer of light energy.

Co-axial alignment of the core of the external light transmission line and the core of optical fiber 15 is no longer critical since light injected into the cladding of optical fiber 15 is no longer lost.

Further, a larger core, external light transmission line may now be utilized, effectively increasing the light "power" handling capability of the device since the larger core of the external transmission line may now couple to both the central core and the cladding of optical fiber 15.

A reciprocal increase in efficiency is experienced since, assuming op-el device 10 is a light emitting source, light, once considered lost when coupled into the cladding of optical fiber 15 from op-el device 10, may now be transferred via both the core and the cladding of optical fiber 15 to the external light transmission line at junction 143 in optical connector 14.

Thus, in accordance with the teachings herein, optical fiber 15 may be comprised of a single optical fiber having a core diameter of, say, 200 micrometers (approximately 8 mils). It may have a thin or thick cladding. It may be metalized so as to provide a mirror-like interface along its outer surface. The embodiment suggested for greatest efficiency and light handling ability is that in which optical fiber 15 is a thick clad fiber, metalized as set forth herein, in which the cladding is utilized as a light transmissive medium as well as is the central core.

Fiber optic connector 14 may be a commercial connector of which the Amphenol series 905 and 906 are typical.

What we have described are means and methods for achieving a low profile optical coupling to a planar mounted op-el device. Maintaining the op-el device planar to the substrate on which it and associated circuitry are mounted enables the use of standard, well known manufacturing assembly techniques while providing electrical connection to the electric ports of said op-el device. Optical fiber light coupling is utilized. The low profile of the overall package is achieved by introducing the optical fiber on a plane which is generally parallel to the light active surface of the optic port of said op-el device. Actual optical coupling is achieved by introducing a smooth radius bend in the optical fiber so as to bring the fiber and the light active surface of the op-el device into generally orthogonal relationship. A glass-to-metal seal is provided where the optical fiber enters the package so as to provide a hermetic seal. Further mechanical and environmental support is provided by encapsulating the assembly within its package in an encapsulating medium having an index of refraction essentially matching that of the core of the optical fiber so as to reduce the possibility of reflective losses at the juncture of the fiber and said light active surface.

In addition we have disclosed means and method for increasing efficiency and light handling ability of an optical light fiber by providing a mirror-like interface along its entire length and utilizing both the central core and its cladding as light transmission media.

While the invention has been particularly described and shown in reference to the preferred embodiments thereof it will be understood by those skilled in the art that various changes in form and detail and omissions may be made therein without departing from the spirit and scope of the invention.

What is claimed is:

1. A low profile fiber optic module comprising:
    a housing; and
    at least one optoelectronic device disposed within said housing; and
    light fiber means having a first portion passing through and supported only by a side portion of said housing and having a second substantially orthogonal freestanding portion for coupling extramodular light to said device through substantially a 90° angle, said second portion being supported only by and being biased against said device.

2. The module of claim 1 wherein one of said portions maintaining said device in position on said housing during its assembly to said housing.

3. A method for achieving a low-profile housing for coupling external light through substantially a 90° angle to an optoelectronic device within said housing, the method comprising the step of disposing optical fiber means having first and second substantially orthogonal freestanding portions between said device and said housing by attaching the first of said portions only to said housing at a side portion thereof and biasing the second of said portions against said device.

4. The method of claim 3 where said compressive force maintains said device in position in said housing during its assembly to said housing.

* * * * *